United States Patent
Kwon et al.

(10) Patent No.: US 11,003,531 B2
(45) Date of Patent: May 11, 2021

(54) MEMORY SYSTEM AND OPERATING METHOD THEREOF

(71) Applicant: SK hynix Inc., Gyeonggi-do (KR)

(72) Inventors: Jung-Hyun Kwon, Seoul (KR);
Do-Sun Hong, Gyeonggi-do (KR);
Seung-Gyu Jeong, Gyeonggi-do (KR);
Won-Gyu Shin, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 184 days.

(21) Appl. No.: 16/038,792

(22) Filed: Jul. 18, 2018

(65) Prior Publication Data
US 2019/0188077 A1 Jun. 20, 2019

(30) Foreign Application Priority Data
Dec. 20, 2017 (KR) .................. 10-2017-0176215

(51) Int. Cl.
| G06F 11/10 | (2006.01) |
| G06F 11/00 | (2006.01) |
| G11C 29/52 | (2006.01) |
| G11C 29/42 | (2006.01) |
| G11C 29/04 | (2006.01) |

(52) U.S. Cl.
CPC ...... *G06F 11/1072* (2013.01); *G06F 11/1056* (2013.01); *G06F 11/1064* (2013.01); *G11C 29/42* (2013.01); *G11C 29/52* (2013.01); *G06F 2201/81* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS 9,336,081 B2   5/2016 Liang
2019/0116052 A1* 4/2019 Kim ..................... G06F 7/588

FOREIGN PATENT DOCUMENTS

KR    1020130049464    5/2013

* cited by examiner

*Primary Examiner* — Justin R Knapp
(74) *Attorney, Agent, or Firm* — IP & T Group LLP (57) ABSTRACT

A memory system includes: a memory device, including a plurality of memory cells, suitable for reading and writing data with a parity bit on a basis of a page; and a memory controller suitable for obtaining an error mask pattern based on compressed data when a number of error bits detected based on the data and the parity bit is equal to or less than a first threshold value and greater than a second threshold value, and controlling to write the compressed data, the parity bit updated based on the compressed data in which the error mask pattern is reflected, compression information on the compressed data and pattern information on the error mask pattern to the page.

19 Claims, 9 Drawing Sheets

FIG. 8

MEMORY SYSTEM AND OPERATING METHOD THEREOF

CROSS-REFERENCE TO RELATED APPLICATIONS

This application claims priority under 35 U.S.C. § 119 to Korean Patent Application No. 10-2017-0176215, filed on Dec. 20, 2017, the disclosure of which is incorporated herein by reference in its entirety.

BACKGROUND

1. Field

Various exemplary embodiments of the disclosure relate to a semiconductor design technique, and more particularly, to a memory system performing an error correction operation.

2. Description of the Related Art

Previously in the semiconductor memory device industry, a number of original good dies with no defective memory cells in a memory chip manufactured through a semiconductor manufacturing process may be distributed on a wafer. However, as capacity of a memory device increases, it becomes more difficult to fabricate a memory device without any defective memory cells. It may be less likely that a memory device with no defective memory cells can be fabricated. To handle this issue, a memory device may include redundancy memory cells for repairing defective memory cells.

Additionally, an error correction code (ECC) circuit may be used to correct some errors occurring in memory cells and other errors occurring in data transferred during a read operation and a write operation of a memory system.

SUMMARY

Various embodiments of the disclosure are directed to a memory system that may mask a plurality of error bits by obtaining an error mask pattern for the error bits of a space remaining after compressing data of a page in which the error bits occur.

In accordance with an embodiment of the present invention, a memory system includes: a memory device, including a plurality of memory cells, suitable for reading and writing data with a parity bit on a basis of a page; and a memory controller suitable for obtaining an error mask pattern based on compressed data when a number of error bits detected based on the data and the parity bit is equal to or less than a first threshold value and greater than a second threshold value, and controlling to write the compressed data, the parity bit updated based on the compressed data in which the error mask pattern is reflected, compression information on the compressed data and pattern information on the error mask pattern to the page.

In accordance with an embodiment of the present invention, an operating method of a memory system includes: detecting and correcting a number of error bits based on data and a parity bit which are read out from a specific page; compressing error-corrected data to generate compressed data when the number of error bits is equal to or less than a first threshold value and greater than a second threshold value; obtaining an error mask pattern based on the compressed data; updating the parity bit corresponding to the compressed data in which the error mask pattern is reflected; and writing the compressed data, the updated parity bit, compression information on the compressed data and pattern information on the error mask pattern to the page.

In accordance with an embodiment of the present invention, an operating method of a memory system includes: checking how many writable pages are in a memory device; compressing write data to generate compressed data when a number of writable pages is within a specific threshold; obtaining an error mask pattern based on the compressed data; generating a parity bit corresponding to the compressed data in which the error mask pattern is reflected; and writing the compressed data, the parity bit, compression information on the compressed data and pattern information on the error mask pattern to a specific page.

DETAILED DESCRIPTION

Various embodiments of the disclosure will be described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention.

Moreover, it is noted that the terminology used herein is for the purpose of describing the embodiments only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

Figure 1:
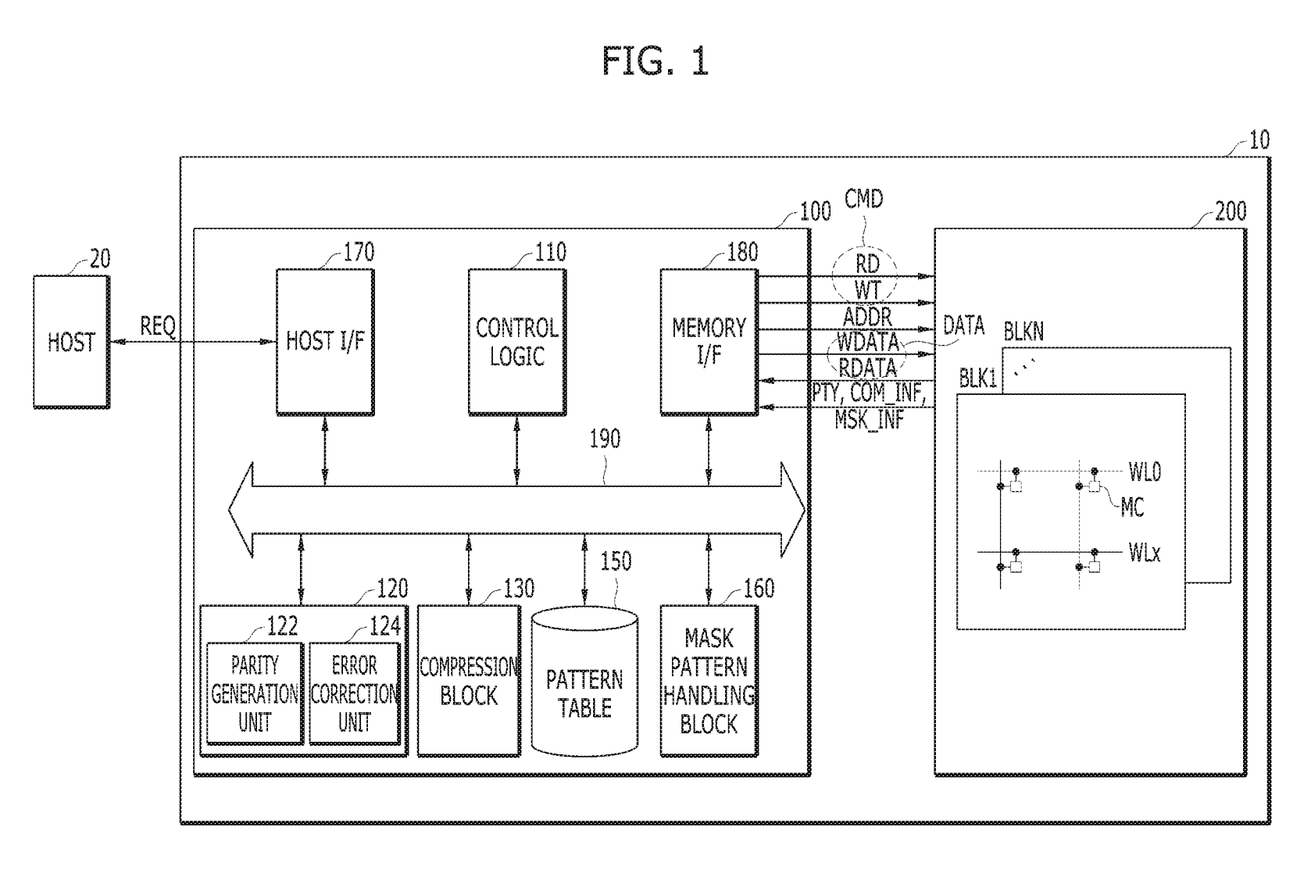
FIG. 1 is a block diagram illustrating a data storage system including a memory system in accordance with an embodiment of the disclosure.

FIG. 1 is a block diagram illustrating a data processing system to which a memory system 10 is applied in accordance with an embodiment of the disclosure.

Referring to FIG. 1, the data processing system may include the memory system 10 and a host 20.

The host 20 may include an independent and substantial processor, which may be referred to as a core. The host 20 may be implemented with a single processor or a multi-core processor including two or more processors.

The memory system 10 operates in response to a request REQ of the host 20, and particularly, stores data accessed by the host 20. In other words, the memory system 10 may be used as a main memory device or an auxiliary memory device of the host 20. The memory system 10 includes a memory device 200 that stores the data accessed by the host 20 and a memory controller 100 that controls storing the data into the memory device 200.

The memory device 200 may retain the stored data even though a power source is not supplied, store data provided from the host 20 during a write operation, and provide the stored data to the host 20 during a read operation. The memory device 200 includes a plurality of memory blocks BLK1 to BLKN. Each of the memory blocks BLK1 to BLKN includes a plurality of memory cells MC coupled to intersections of a plurality of word lines WL and a plurality of bit lines BL.

The memory controller 100 may transmit a command CMD, a data DATA and an address ADDR to the memory device 200 in response to the request REQ entered from the host 20. The memory controller 100 may control an operation of the memory device 200. The command CMD may include a write command WT commanding the write operation and a read command RD commanding the read operation. The data DATA may include a write data WDATA provided to the memory device 200 during the write operation and a read data RDATA read out from the memory device 200 during the read operation.

By way of example but not limitation, when the request REQ entered from the host 20 is a write request, the memory controller 100 may transmit a write command WT, a write data WDATA and an address ADDR corresponding to target memory cells of the memory device 200 to the memory device 200. The memory controller 100 may control the write operation to program the write data WDATA into the target memory cells selected according to the address ADDR. On the other hand, when the request REQ inputted from the host 20 is a read request, the memory controller 100 may transmit a read command RD and an address ADDR corresponding to target memory cells of the memory device 200 to the memory device 200. The memory controller 100 may control the read operation to read out the read data RDATA from the target memory cells selected according to the address ADDR.

In a case when the memory system 10 performs an error correction operation, the memory controller 100 may generate and receive an error correction code with either the write data WDATA or the read data RDATA. Here, the error correction code, for example, a parity bit PTY, is for correcting some error bits of the write data WDATA or the read data RDATA. During the write operation, the memory controller 100 may generate the parity bit PTY corresponding to the write data WDATA, transmit the parity bit PTY along with the write data WDATA to the memory device 200, and control to program the write data WDATA and the parity bit PTY together into the target memory cells. During the read operation, the memory device 200 may transmit the parity bit PTY and the read data RDATA to the memory controller 100, and the memory controller 100 may use the parity bit PTY to correct the error bits of the read data RDATA.

The memory device 200 may read or write the data DATA and the parity bit PTY to the target memory cells on a basis of a page. That is, the write data WDATA and parity bit PTY written to the target memory cells in response to one write command WT may constitute one page or one code word. Similarly, the read data RDATA and parity bit PTY read out from the target memory cells in response to one read command RD may constitute one page or one code word.

Figure 2A:
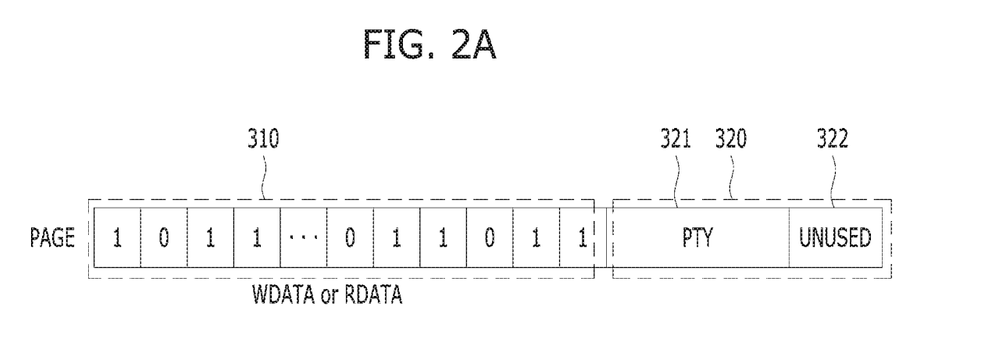
FIGS. 2A and 2B are diagrams for describing a configuration of a page in accordance with an embodiment of the disclosure.
Figure 2B:
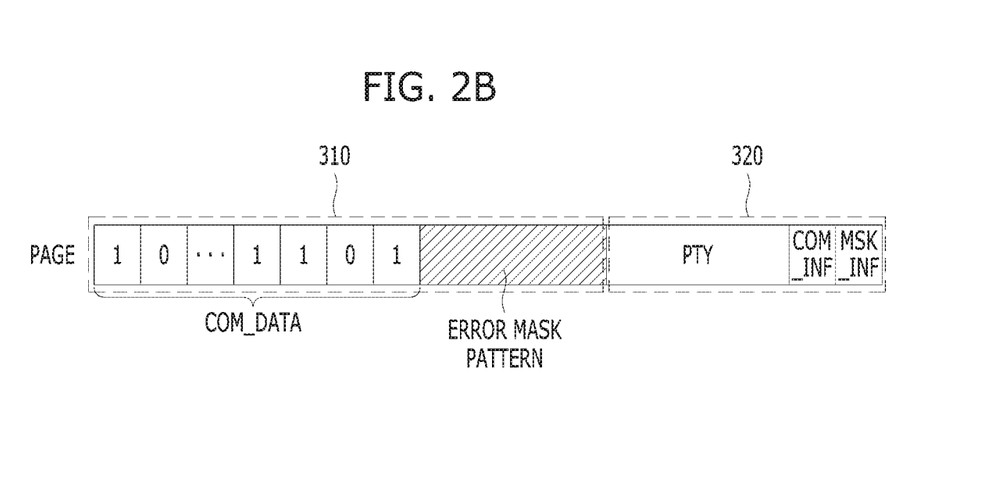

FIGS. 2A and 2B are diagrams for describing a configuration of a page in accordance with an embodiment of the disclosure.

Referring to FIG. 2A, the page may be composed of a data region 310 where the write data WDATA or the read data RDATA is written and an error correction code (ECC) region 321 where the parity bit PTY for detecting and correcting error bits of corresponding data is written. The ECC region 321 may be disposed in a spare region 320 of the page. Generally, as shown in FIG. 2A, a remaining region except the ECC region 321 in the spare region 320 is allocated to an unused region 322. When the operation of the memory device 200 is abnormally completed, metadata that may be used to restore data written in the data region 310 is not additionally stored or used.

However, in the disclosure, when the number of error bits detected based on the read data RDATA and parity bit PTY read out during the read operation is less than the number of correctable error bits but is close to the number of correctable error bits, that is, when current error correction succeeds but the next error correction is likely to fail, the memory controller 100 may compress the read data RDATA to generate compressed data COM_DATA. The memory controller 100 may control the memory device 200 to obtain an error mask pattern based on the compressed data COM_DATA. The memory controller 100 may make the memory device 200 rewrite the compressed data COM_DATA, the parity bit PTY regenerated (i.e., updated) based on the compressed data COM_DATA to which the error mask pattern is applied, compression information COM_INF on the compressed data COM_DATA and pattern information MSK_INF on the error mask pattern to a corresponding page. As shown in FIG. 2B, the compressed data COM_DATA, the parity bit PTY, the compression information COM_INF and the pattern information MSK_INF may constitute a single page. Particularly, the compressed data COM_DATA may be stored in the data region 310 of the page, and the parity bit PTY, the compression information COM_INF and the pattern information MSK_INF may be stored in the spare region 320 of the page.

Referring back to FIG. 1, the memory controller 100 may include a control logic 110, an error correction code (ECC) circuit 120, a compression block 130, a pattern table 150, a mask pattern handling block 160, a host interface (I/F) 170, and a memory interface (I/F) 180. Each of the components may be electrically coupled, or engaged with each other coupled via a bus 190.

The bus 190 denotes a transmission path that transmits data between internal configurations of the memory controller 100.

The host I/F 170, which is arranged between the host 20 and the memory controller 100, may buffer the requests REQ inputted from the host 20, transmit the buffered requests REQ to the internal configurations, and transmit results obtained by processing the requests REQ to the host 20.

The control logic 110 may control entire operations of the memory system 10. The control logic 110 may generate the command CMD, the data DATA and the address ADDR for controlling the write operation or the read operation of the memory device 200 in response to the request REQ of the host 20. In addition, the control logic 110 may determine or estimate which memory block has the high possibility of error bits based on error information of the read data RDATA provided from the ECC circuit 120 so that a specific memory block may not be used, thereby enhancing performance of the memory system 10.

The ECC circuit 120 may generate the parity bit PTY corresponding to the write data WDATA provided from the host 20 during the write operation. The ECC circuit 120 may include a parity generation unit 122 that provides the generated parity bit PTY along with the write data WDATA to the memory device 200. Also, the ECC circuit 120 may include an error correction unit 124 that detects and corrects error bits included in the read data RDATA by using the parity bit PTY read out from the memory device 200 during the read operation. By way of example but not limitation, the error correction unit 124 may perform an error correction operation based on a coded modulation such as a low density parity check (LDPC) code, a Bose-Chaudhri-Hocquenghem (BCH) code, a turbo code, a Reed-Solomon code, a convolution code, a recursive systematic code (RSC), a trellis-coded modulation (TCM) and a block-coded modulation (BCM).

When error correction succeeds, that is, the number of detected error bits is equal to or less than the number of correctable error bits (hereinafter, referred to as a "first threshold value TH1"), the ECC circuit 120 may provide the read data whose error is corrected to the host 20 through the host I/F 170. Also, the ECC circuit 120 may generate patterns based on the error bits included in the read data RDATA when the error correction fails and store the generated patterns in the pattern table 150.

When the error correction fails, that is, the number of the detected error bits is greater than the first threshold value TH1, the ECC circuit 120 may notify an error failure signal to the host 20 through the host I/F 170. The ECC circuit 120 may provide error information to the control logic 110 so that a corresponding operation may be performed. Particularly, in the disclosure, when the current error correction succeeds but the next error correction is likely to fail, that is, the number of the detected error bits is equal to or less than the first threshold value TH1 and greater than a second threshold value TH2, the parity generation unit 122 may regenerate (i.e., update) the parity bit PTY corresponding to the compressed data COM_DATA. The second threshold value TH2 may be smaller than the first threshold value TH1.

When the number of the detected error bits is equal to or less than the first threshold value TH1 and greater than the second threshold value TH2, the compression block 130 may compress the read data whose error is corrected to generate the compressed data COM_DATA, and generate the compression information COM_INF on the compressed data COM_DATA.

The pattern table 150 may store a plurality of mask patterns, which are defined in advance. The pattern table 150 may store the patterns generated by the ECC circuit 120 when the error correction fails.

The mask pattern handling block 160 may obtain the error mask pattern based on the compressed data COM_DATA to generate the pattern information MSK_INF on the error mask pattern. The mask pattern handling block 160 may check a position of error bits of the data region (a hatched portion in FIG. 2B) excluding the compressed data COM_DATA, select a pattern capable of maximally covering the error bits among the patterns stored in the pattern table 150 as the error mask pattern, and generate the pattern information MSK_INF on the error mask pattern.

The memory I/F 180 may be disposed between the memory controller 100 and the memory device 200, transmit the command CMD and the address ADD from the memory controller 100 to the memory device 200, and transfer the data DATA between the memory device 200 and the memory controller 100. Particularly, the memory I/F 180 may transmit the compressed data, the updated parity bit, the compression information and the pattern information on the basis of the page as described with reference to FIG. 2B to the memory device 200.

The memory controller 100 described above includes only configurations directly related to the disclosure but may further include other configurations in addition to the configurations described above. By way of example but not limitation, the memory controller 100 may further include a memory (not illustrated) for storing data for driving the memory controller 100, as an operation memory of the memory controller 100. When the memory controller 100 provides the read data RDATA to the host 20 and the write data WDATA to the memory device 200 in response to the request REQ of the host 20, the memory may temporarily store data required for operations of the memory controller 100 and memory device 200. According to embodiments, the pattern table 150 may be included in the memory.

Figure 3:
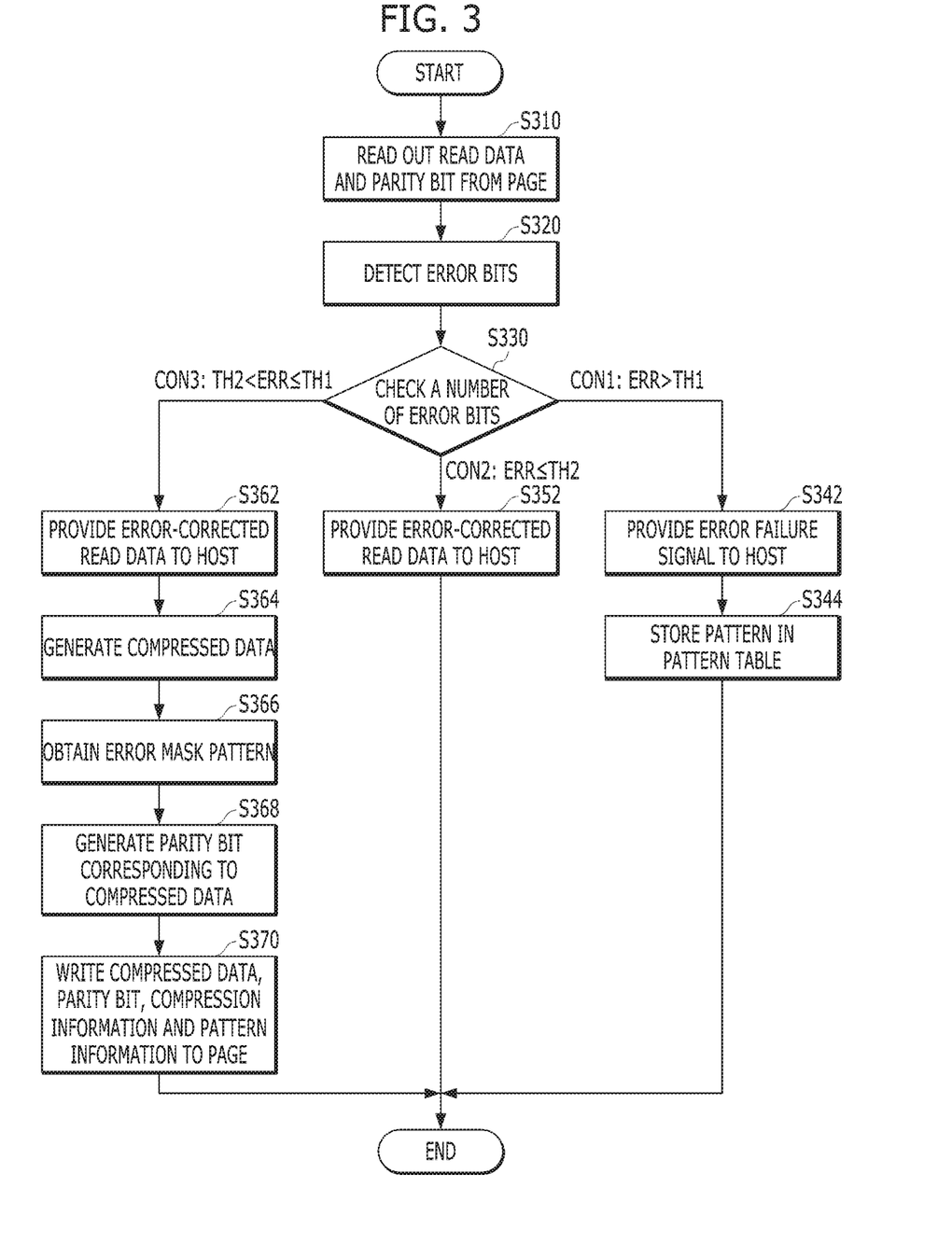
FIG. 3 is a flowchart illustrating an operation of a memory system shown in FIG. 1.

FIG. 3 is a flowchart illustrating an operation of the memory system 10 shown in FIG. 1.

Referring to FIG. 3, the memory I/F 180 of the memory controller 100 receives the read data RDATA and the parity bit PTY from a specific page of the memory device 200 in step S310. The ECC circuit 120 detects the error bits included in the read data RDATA based on the parity bit PTY read out from the memory device 200 in step S320.

When the number of the detected error bits is greater than the first threshold value TH1 (that is, "CON1" in step S330), the ECC circuit 120 provides the error failure signal to the host 20 through the host I/F 170 in step S342. The ECC circuit 120 may generate the patterns based on the error bits included in the read data RDATA where the error correction fails, and store the generated patterns in the pattern table 150 in step S344.

When the number of the detected error bits is equal to or less than the second threshold value TH2 (that is, "CON2" in step S330), the ECC circuit 120 provides the read data whose error is corrected to the host 20 through the host I/F 170 in step S352.

When the number of the detected error bits is less than the number of correctable error bits but is close to the number of correctable error bits, that is, the number of the detected error bits is equal to or less than the first threshold value TH1 and greater than the second threshold value TH2 (that is, "CON3" in step S330), the ECC circuit 120 provides the read data whose error is corrected to the host through the host I/F 170 in step S362. The compression block 130 generates the compressed data COM_DATA by compressing the read data whose error is corrected in step S364. The compression block 130 generates the compression information COM_INF on the compressed data COM_DATA. The mask pattern handling block 160 checks the position of the error bits of the data region excluding the compressed data COM_DATA. The mask pattern handling block 160 obtains the pattern capable of maximally covering the error bits among the patterns stored in the pattern table 150 as the error mask pattern. The mask pattern handling block 160 generates the pattern information MSK_INF on the error mask pattern. Subsequently, the ECC circuit 120 updates the parity bit PTY based on the compressed data COM_DATA in which the error mask pattern is reflected in step S368. The memory I/F 180 transmits the compressed data COM_DATA, the updated parity bit PTY, the compression information COM_INF and the pattern information MSK_INF on the basis of the page as described above with reference to FIG. 2 to the memory device 200 to be written in the page in step S370.

In the memory system in accordance with the embodiment of the disclosure as described above, when the number of error bits is less than but close to the number of correctable error bits, the error bits are rearranged to be concentrated in an area remaining after data of a corresponding page is compressed, and the area is masked based on an error mask pattern. Further, the parity bit is updated using the compressed data in which the error mask pattern is reflected. The compressed data, the updated parity bit, the compression information and the pattern information are rewritten to the memory device. Generally, when a position where the error bits occur is stuck to a specific bit, for example, a high bit "1", the probability of error occurrence is quite high even if the position where the error bits occur is zero-padded with a low bit. In the disclosure, the error bits are originally blocked by reflecting the error mask pattern without padding the compressed and remaining space with a low bit or a high bit, whereby error correction performance of the memory system may be improved.

Hereinafter, detailed configurations and operations of the memory system of the disclosure will be described with reference to drawings.

Figure 4:
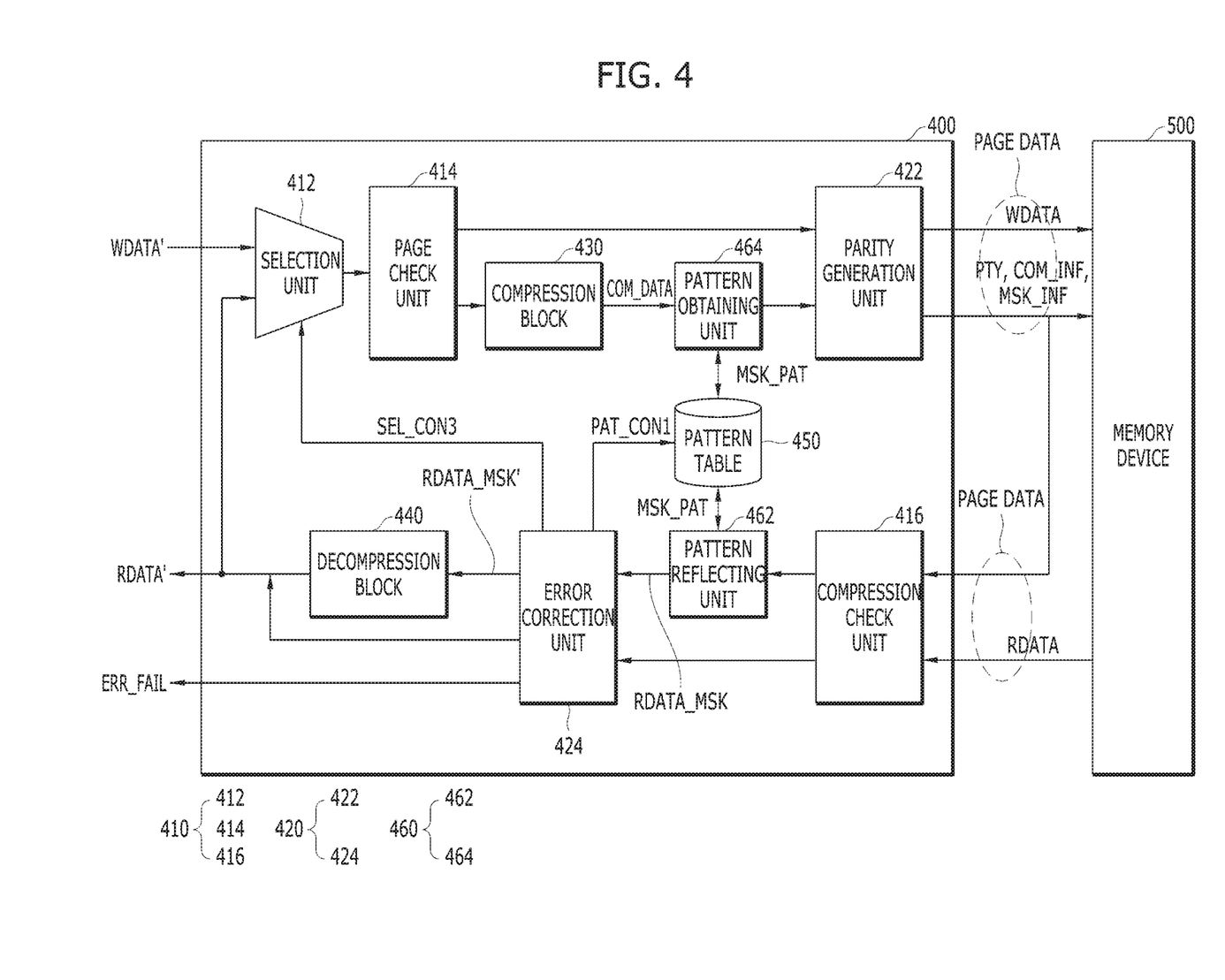
FIG. 4 is a block diagram illustrating a memory system in accordance with an embodiment of the disclosure.

FIG. 4 is a block diagram illustrating a memory system in accordance with an embodiment of the disclosure. FIG. 4 shows only configurations directly related to transmission of data in the memory system. Configurations related to a command CMD and an address ADDR, and configurations interfacing the command CMD and the address ADDR, are omitted herein.

Referring to FIG. 4, a memory controller 400 may include a control logic 410, an error correction code (ECC) circuit 420, a compression block 430, a decompression block 440, a pattern table 450, and a mask pattern handling block 460. The ECC circuit 420 may include a parity generation unit 422 and an error correction unit 424. The mask pattern handling block 460 may include a pattern reflecting unit 462 and a pattern obtaining unit 464. A selection unit 412, a page check unit 414 and a compression check unit 416 may be implemented in a part of the control logic 410.

A memory device 500 may transmit and receive write data WDATA, or read data RDATA, with a parity bit PTY on a basis of a page to and from the memory controller 400. A page may be divided into: a data region (the numeral reference 310 of FIGS. 2A and 2B) where the write data WDATA or the read data RDATA is written, and a spare region (the numeral reference 320 of FIGS. 2A and 2B) where the parity bit PTY, compression information COM_INF and pattern information MSK_INF are disposed. Hereinafter, data constituting a single page is referred as to a "page data".

The compression check unit 416 may check whether the read data RDATA is compressed based on the compression information COM_INF of specific page data provided from the memory device 500 during a read operation. The compression check unit 416 may transmit the page data to the pattern reflecting unit 462 when the read data RDATA is compressed. The compression check unit 416 may transmit the page data to the error correction unit 424 when the read data RDATA is not compressed.

The pattern reflecting unit 462 may search an error mask pattern MSK_PAT corresponding to the pattern information MSK_INF of the page data among patterns stored in the pattern table 450. The pattern reflecting unit 462 may reflect the error mask pattern MSK_PAT in the read data RDATA to generate masked read data RDATA_MSK. The pattern reflecting unit 462 may transmit the page data including the masked read data RDATA_MSK to the error correction unit 424.

The error correction unit 424 may detect and correct error bits of the masked read data RDATA_MSK based on the parity bit PTY of the page data. The error correction unit 424 may generate error-corrected masked read data RDATA_MSK'. The error correction unit 424 may transmit the page data including the error-corrected masked read data RDATA_MSK' to the decompression block 440. The decompression block 440 may decompress the error-corrected masked read data RDATA_MSK' based on the compression information COM_INF of the page data. to output error-corrected read data RDATA' to a host (not illustrated).

The error correction unit 424 may detect and correct the error bits of the read data RADATA, which is transmitted from the compression check unit 416 but not compressed, based on the parity bit PTY of the page data. At this time, the error correction unit 424 may operate as follows under a first condition CON1 where the number of detected error bits is greater than a first threshold value TH1, a second condition CON2 where the number of detected error bits is equal to or less than a second threshold value TH2 and a third condition CON3 where the number of detected error bits is equal to, or less than, the first threshold value TH1 and greater than the second threshold value TH2, e.g., out of range from the first threshold value TH1 to the second threshold value TH2.

Under the first condition CON1, the error correction unit 424 may transmit an error failure signal ERR_FAIL to the host. Also, the error correction unit 424 may generate a pattern PAT_CON1 based on the error bits included in the read data RDATA where error correction fails. The error correction unit 424 may store the pattern PAT_CON1 in the pattern table 450. Accordingly, the pattern table 450 may store a plurality of mask patterns, which are defined in advance. Under the second condition CON2, the error correction unit 424 may provide the error-corrected read data RDATA' to the host. Under the third condition CON3, the error correction unit 424 may provide the error-corrected read data RDATA' to the host to output an activated selection signal SEL_CON3.

The selection unit 412 may select write data WDATA' entered from the host during a write operation or output the error-corrected read data RDATA' provided from the error correction unit 424 during the read operation. The selection unit 412 may select and output the error-corrected read data RDATA' when the selection signal SEL_CON3 is activated under the third condition CON3.

The page check unit 414 may check the number of writable pages based on a storage area of the memory device 500. When the number of writable pages exceeds a specific threshold S_TH, the page check unit 414 may output the write data WDATA' entered from the selection unit 412 to the parity generation unit 422. The specific threshold S_TH may be set to approximately 10% of the total number of pages. When the number of writable pages does not exceed the specific threshold S_TH, that is, the number of writable pages is within approximately 10% of the total number of pages, the page check unit 414 may provide the write data WDATA' to the compression block 430. According to embodiments, the page check unit 414 may transmit a signal, notifying that the number of writable pages is within the specific threshold S_TH, to the host.

The page check unit 414 may provide the error-corrected read data RDATA', inputted from the selection unit 412, to the compression block 430 regardless of the number of writable pages. Although not illustrated, the page check unit 414 may receive the selection signal SEL_CON3 to check which inputted data is the write data WDATA' or the error-corrected read data RDATA'.

The compression block 430 may compress the write data WDATA' or the error-corrected read data RDATA' to generate compressed data COM_DATA. The compression block 430 may generate the compression information COM_INF on the compressed data COM_DATA.

The pattern obtaining unit 464 may obtain the error mask pattern MSK_PAT based on the compressed data COM_DATA, and generate the pattern information MSK_INF on the error mask pattern MSK_PAT. More specifically, the pattern obtaining unit 464 may check a position of error bits of the data region excluding the compressed data COM_DATA. The pattern obtaining unit 464 may select a pattern capable of maximally covering the error bits among the patterns stored in the pattern table 450 as the error mask pattern MSK_PAT. The pattern obtaining unit 464 may generate the pattern information MSK_INF on the error mask pattern MSK_PAT. The pattern obtaining unit 464 may provide the compressed data COM_DATA in which the error mask pattern MSK_PAT is reflected to the parity generation unit 422. According to embodiments, when the error mask pattern MSK_PAT capable of covering the error bits is not searched in the pattern table 450 during the write operation, the pattern obtaining unit 464 may request the page check unit 414 to transmit the write data WDATA' Instead of the compressed data COM_DATA to the parity generation unit 422.

The parity generation unit 422 may generate the parity bit PTY based on the write data WDATA' inputted from the page check unit 414. The write data WDATA and the parity bit PTY included in each page may be transmitted to the memory device 500.

The parity generation unit 422 may generate the parity bit PTY based on the compressed data COM_DATA in which the error mask pattern MSK_PAT inputted from the pattern obtaining unit 464 is reflected. The compressed data COM_DATA, the parity bit PTY, the compression information COM_INF and the pattern information MSK_INF may be transmitted to the memory device 500 on a basis of a single page.

By way of example but not limitation, FIG. 4 shows the parity generation unit 422 outputting the write data WDATA to the memory device 500. According to embodiments, the control logic 110 or the memory I/F 180 shown in FIG. 1 may provide the write data WDATA' or the compressed data COM_DATA as the write data WDATA to the memory device 500.

Figure 5A:
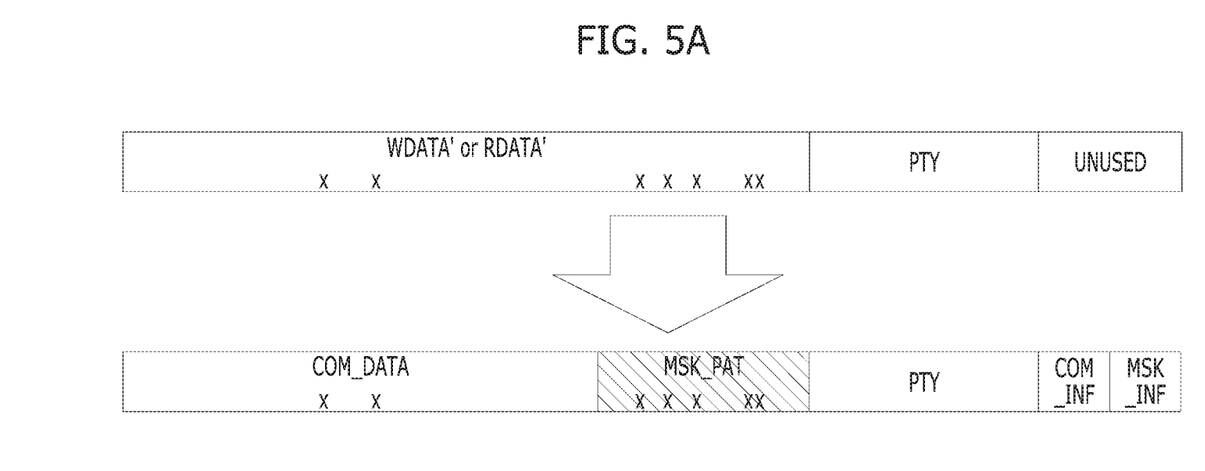
FIGS. 5A and 5B are diagrams for describing a configuration of a page shown in FIG. 4.
Figure 5B:
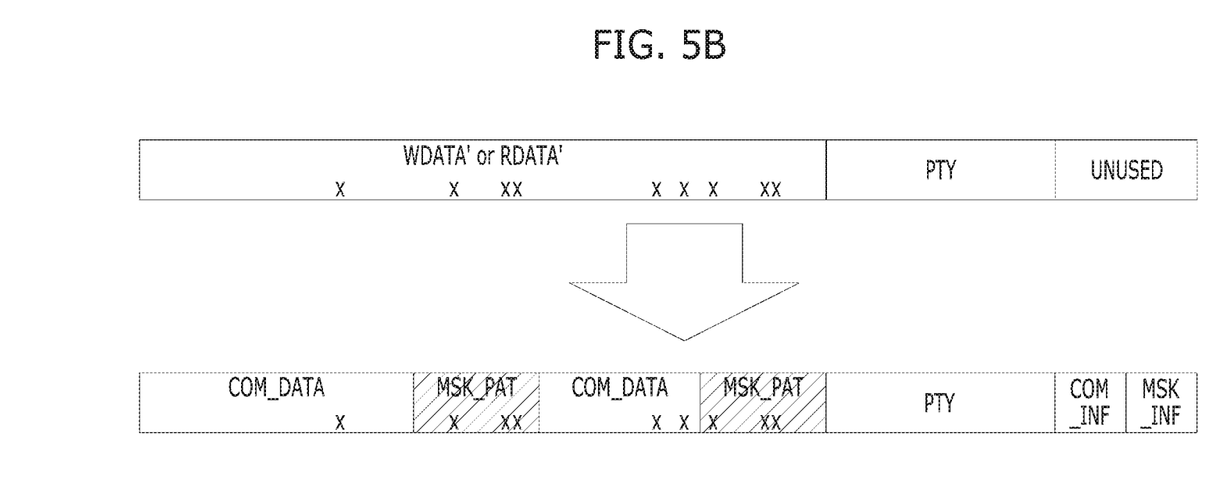

FIGS. 5A and 5B are diagrams for describing a configuration of a page shown in FIG. 4.

Referring to FIGS. 5A and 5B, a case where the write data WDATA' or the read data RDATA' of the data region has 7 error bits is illustrated. The reference symbol "X" denotes a position of each error bit.

The compression block 430 may compress the write data WDATA' or the error-corrected read data RDATA' to generate the compressed data COM_DATA. The compression block 430 may generate the compression information COM_INF on the compressed data COM_DATA. The pattern obtaining unit 464 may obtain the error mask pattern MSK_PAT based on the compressed data COM_DATA. The pattern obtaining unit 464 may generate the pattern information MSK_INF on the error mask pattern MSK_PAT.

As shown in FIG. 5A, when 5 error bits are concentrated in a back (i.e., a lower area) of the data region, the pattern obtaining unit 464 may arrange the compressed data COM_DATA in a front (i.e., an upper area) of the data region to check the position of the error bits of the data region excluding the compressed data COM_DATA. The pattern obtaining unit 464 may select a pattern capable of maximally covering the error bits among the plurality of patterns stored in the pattern table 450 as the error mask pattern MSK_PAT.

As shown in FIG. 5B, when three error bits are sporadically dispersed, the pattern obtaining unit 464 may divide the compressed data COM_DATA into two portions. The pattern obtaining unit 464 may arrange the divided compressed data COM_DATA in an area where the three error bits of the data region are not disposed. The pattern obtaining unit 464 may check the position of the error bits of the data region excluding the compressed data COM_DATA. The pattern obtaining unit 464 may select a pattern capable of maximally covering the error bits among the plurality of patterns stored in the pattern table 450 as the error mask pattern MSK_PAT.

Figure 6:
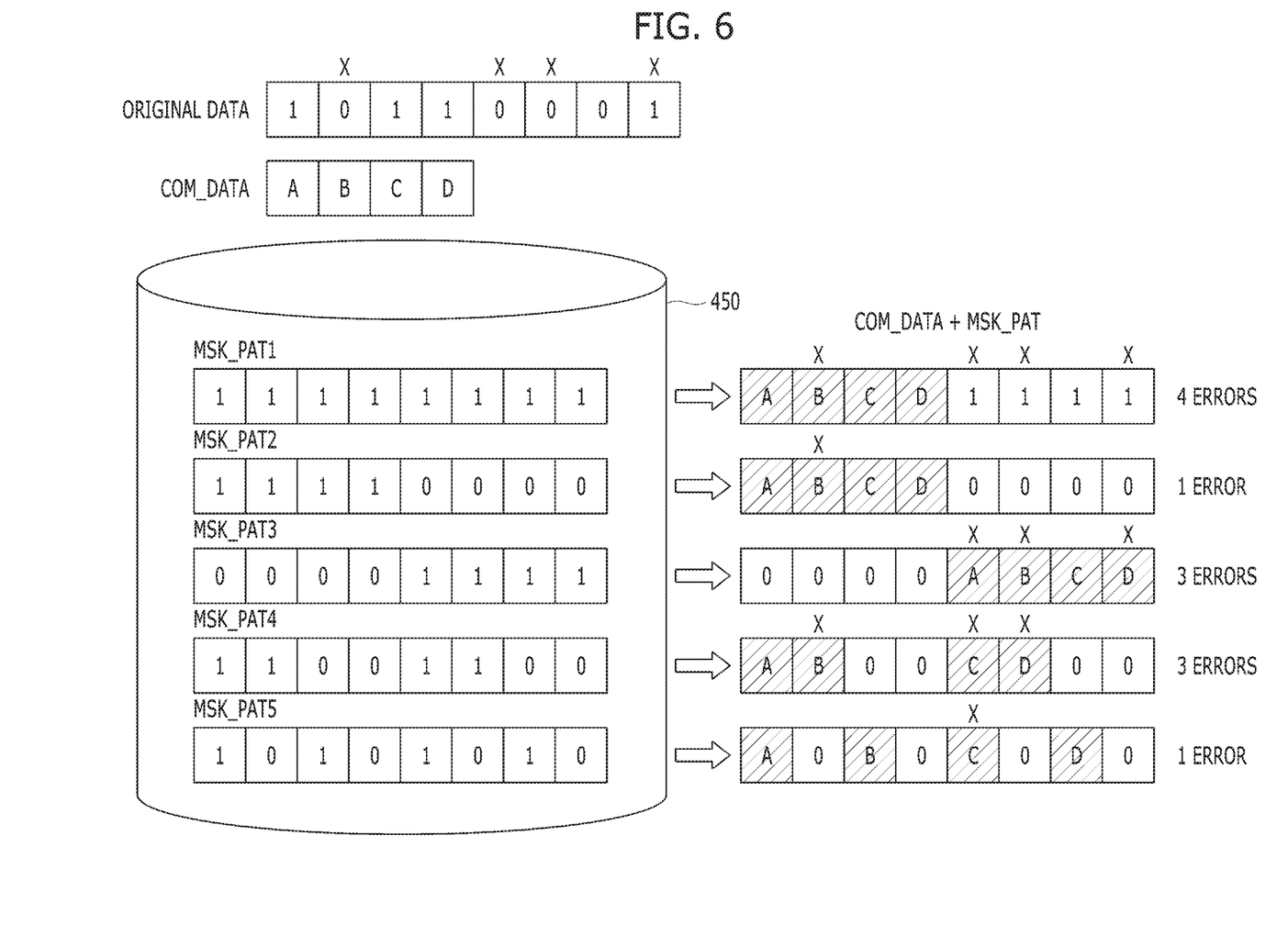
FIG. 6 is a diagram illustrating an operation of a pattern obtaining unit shown in FIG. 4.

FIG. 6 is a diagram illustrating a mask pattern (MSK_PAT) selection operation of the pattern obtaining unit 464 shown in FIG. 4. FIG. 6 illustrates just the data region.

Referring to FIG. 6, a case where original data "10110001" has 8 bits, and error bits included in the original data are 4 bits which are equal to or less than the first threshold value TH1 (for example, 4) and greater than the second threshold value TH2 (for example, 2) is illustrated. In other words, a case where the error bits included in the original data correspond to the third condition CON3 is illustrated in FIG. 6. The error bits are disposed at second, fifth, sixth and eighth bits, respectively, and the compressed data COM_DATA is compressed from the original data at a rate of approximately 50%. The reference symbols "A," "B," "C," "D" are given to distinguish the compressed data COM_DATA.

The pattern table 450 may store first to fifth mask patterns MSK_PAT1 to MSK_PAT5 which are defined in advance. A masking target bit is masked when a bit of a mask pattern is a low bit "0".

In case of the first mask pattern MSK_PAT1 whose pattern bits are composed of a high bit, the pattern obtaining unit 464 may randomly arrange the compressed data COM_DATA in the data region. Since the error bits are not masked wherever the compressed data COM_DATA is disposed, the number of error bits detected from the compressed data COM_DATA in which the first mask pattern MSK_PAT1 is reflected is 4.

In a case when the second mask pattern MSK_PAT2 includes upper 4 bits composed of the high bit, the pattern obtaining unit 464 may arrange the compressed data COM_DATA in the front (i.e., the upper area) of the data region. Since error bits of the data region excluding the compressed data COM_DATA are masked, the number of error bits detected from the compressed data COM_DATA in which the second mask pattern MSK_PAT2 is reflected is 1.

In case of the third mask pattern MSK_PAT3 whose lower 4 bits are composed of the high bit, the pattern obtaining unit 464 may arrange the compressed data COM_DATA in the back (i.e., the lower area) of the data region. Since error bits of the data region excluding the compressed data COM_DATA are masked, the number of error bits detected from the compressed data COM_DATA in which the third mask pattern MSK_PAT3 is reflected is 3.

In case of the fourth mask pattern MSK_PAT4 composed of "11001100", the pattern obtaining unit 464 may divide the compressed data COM_DATA and arrange the divided compressed data COM_DATA in the front and back of the data region, respectively. Since error bits of the data region excluding the compressed data COM_DATA are masked, the number of error bits detected from the compressed data COM_DATA in which the fourth mask pattern MSK_PAT4 is reflected is 3.

In case of the fifth mask pattern MSK_PAT5 composed of "10101010", the pattern obtaining unit 464 may arrange the compressed data COM_DATA at odd-numbered bit positions of the data region. Since error bits of the data region excluding the compressed data COM_DATA are masked, the number of error bits detected from the compressed data COM_DATA in which the fifth mask pattern MSK_PAT5 is reflected is 1.

In the above-described cases, the pattern obtaining unit 464 may select the second mask pattern MSK_PAT2 or the fifth mask pattern MSK_PAT5 where a minimum number of the error bits is detected as the error mask pattern MSK_PAT.

Hereinafter, an operation of the memory system shown in FIG. 4 will be described with reference to FIGS. 4 to 8.

Figure 7:
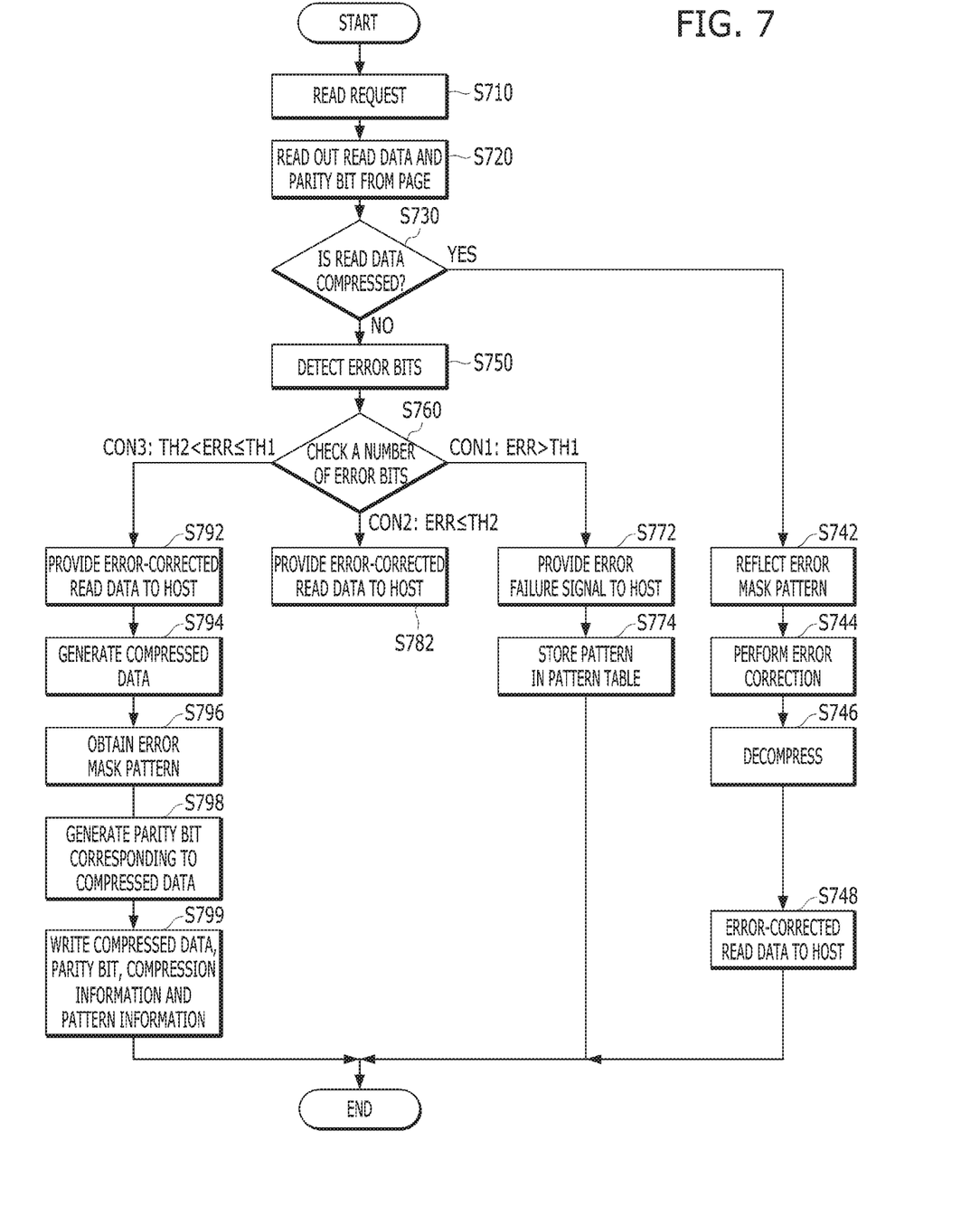
FIG. 7 is a flowchart illustrating a read operation of a memory system shown in FIG. 4.

FIG. 7 is a flowchart illustrating the read operation of the memory system shown in FIG. 4.

Referring to FIG. 7, when a read request is inputted from the host in step S710, the memory controller 400 receives page data from a specific page of the memory device 500 in step S720. The page data may include the read data RDATA and the parity bit PTY. When the read data RDATA is compressed, the page data may include the compressed data COM_DATA, the parity bit PTY, the compression information COM_INF, and the pattern information MSK_INF.

The compression check unit 416 checks whether or not the read data RDATA is compressed based on the compression information COM_INF of the page data in step S730.

When the read data RDATA is compressed (that is, "YES" in step S730), the pattern reflecting unit 462 searches the error mask pattern MSK_PAT corresponding to the pattern information MSK_INF of the page data among the patterns stored in the pattern table 450. The pattern reflecting unit 462 reflects the error mask pattern MSK_PAT in the read data RDATA to generate the masked read data RDATA_MSK in step S742. The error correction unit 424 detects and corrects error bits of the masked read data RDATA_MSK based on the parity bit PTY of the page data. The error correction unit 424 generates the error-corrected masked read data RDATA_MSK' in step S744. The decompression block 440 decompresses the error-corrected masked read data RDATA_MSK' based on the compression information COM_INF of the page data in step S746. The decompression block 440 provides the error-corrected read data RDATA' to the host in step S748. Accordingly, the read operation is completed.

When the read data RDATA is not compressed (that is, "NO" in step S730), the error correction unit 424 detects error bits of the read data RDATA, which is transmitted from the compression check unit 416 and is not compressed, based on the parity bit PTY of the page data in step S750.

The error correction unit 424 checks the number of detected error bits in step S760. The error correction unit 424 divides an outcome of the check into the first condition CON1 where the number of the detected error bits is greater than the first threshold value TH1, the second condition CON2 where the number of the detected error bits is equal to or less than the second threshold value TH2 and the third condition CON3 where the number of the detected error bits is equal to or less than the first threshold value TH1 and greater than the second threshold value TH2.

Under the first condition CON1, the error correction unit 424 provides the error failure signal ERR_FAIL to the host in step S772. The error correction unit 424 may generate the pattern PAT_CON1 based on the error bits included in the read data RDATA whose error correction fails. The error correction unit 424 may store the pattern PAT_CON1 in the pattern table 450 in step S774. Accordingly, the read operation is completed.

Under the second condition CON2, the error correction unit 424 provides the error-corrected read data RDATA' to the host in step S782. Accordingly, the read operation is completed.

Under the third condition CON3, the error correction unit 424 provides the error-corrected read data RDATA' to the host in step S792. The error correction unit 424 activates and outputs the selection signal SEL_CON3. The selection unit 412 selects and outputs the error-corrected read data RDATA'. The page check unit 414 provides the error-corrected read data RDATA' inputted from the selection unit 412 to the compression block 430 regardless of the number of writable pages.

The compression block 430 compresses the error-corrected read data RDATA' to generate the compressed data COM_DATA in step S794. The compression block 430 generates the compression information COM_INF on the compressed data COM_DATA. The pattern obtaining unit 464 obtains the error mask pattern MSK_PAT based on the compressed data COM_DATA in step S796. The pattern obtaining unit 464 generates the pattern information MKS_INF on the error mask pattern MSK_PAT. The pattern obtaining unit 464 provides the compressed data COM_DATA in which the error mask pattern MSK_PAT is reflected to the parity generation unit 422.

The parity generation unit 422 generates the parity bit PTY based on the compressed data COM_DATA in which the error mask pattern MSK_PAT is reflected inputted from the pattern obtaining unit 464 in step S798. The compressed data COM_DATA, the parity bit PTY, the compression information COM_INF and the pattern information MSK_INF may be transmitted and written to the memory device 500 on a basis of a single page in step S799. Accordingly, the read operation is completed.

Figure 8:
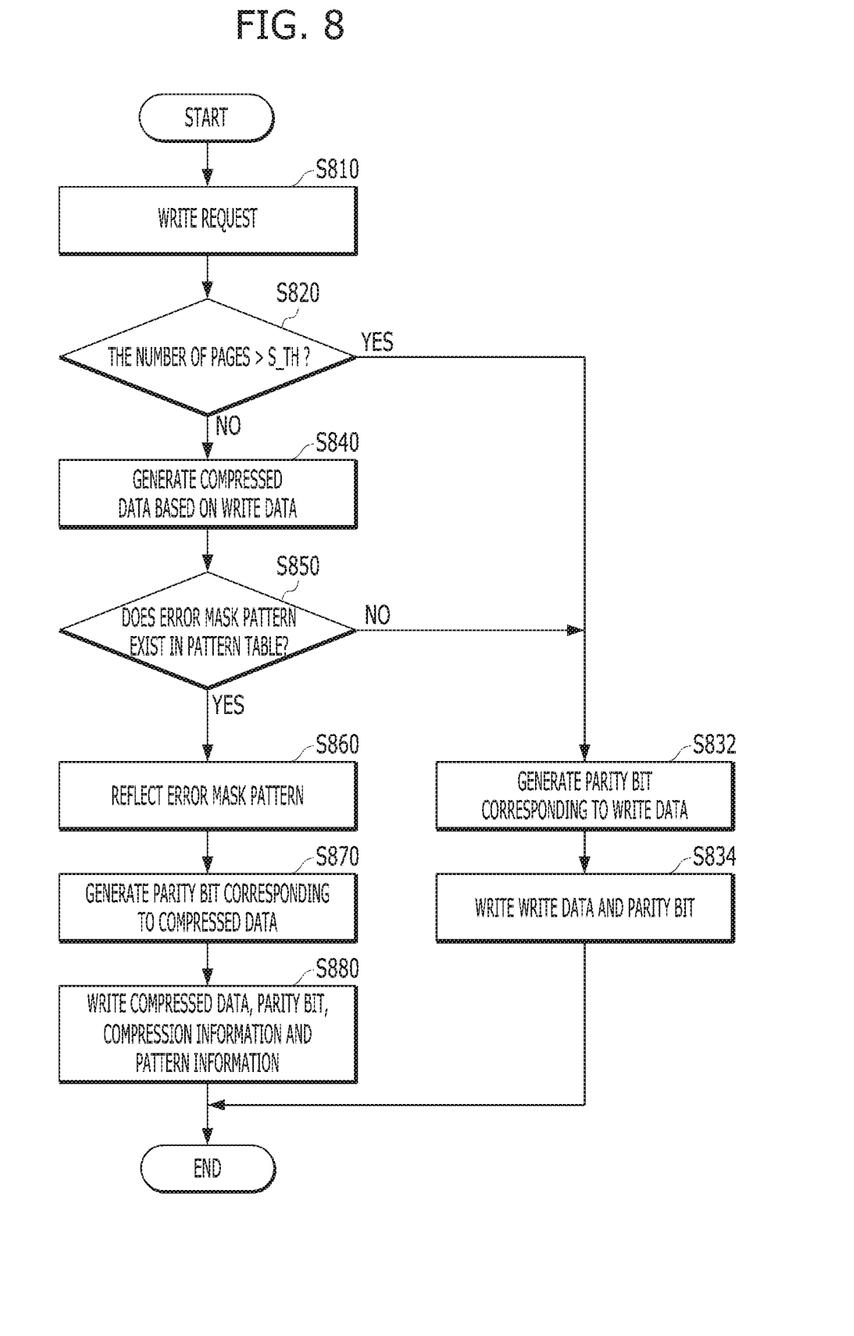
FIG. 8 is a flowchart illustrating a write operation of a memory system shown in FIG. 4.

FIG. 8 is a flowchart illustrating the write operation of the memory system shown in FIG. 4.

Referring to FIG. 8, when a write request is inputted from the host in step S810, the selection unit 412 selects and outputs the write data WDATA' provided from the host.

The page check unit 414 checks the number of writable pages based on a storage area of the memory device 500 in step S820.

When the number of writable pages exceeds the specific threshold S_TH (that is, "YES" in step S820), the page check unit 414 provides the write data WDATA' inputted from the selection unit 412 to the parity generation unit 422. The parity generation unit 422 generates the parity bit PTY based on the write data WDATA' inputted from the page check unit 414 in step S832. The write data WDATA' and the parity bit PTY may be transmitted to the memory device 500 on a basis of a single page in step S834. Accordingly, the write operation is completed.

When the number of writable pages does not exceed the specific threshold S_TH (that is, "NO" in step S820), the page check unit 414 provides the write data WDATA' to the compression block 430. Although not illustrated, the page check unit 414 may transmit a signal notifying that the writable pages are within the specific threshold S_TH to the host. The compression block 430 compresses the write data WDATA' to generate the compressed data COM_DATA in step S840. The compression block 430 generates the compression information COM_INF on the compressed data COM_DATA.

The pattern obtaining unit 464 checks a position of the error bits of the data region excluding the compressed data COM_DATA. The pattern obtaining unit 464 searches a pattern capable of maximally covering the error bits among the plurality of patterns stored in the pattern table 450 in step S850.

When the error mask pattern MSK_PAT capable of covering the error bits does not exist in the pattern table 450 (that is, "NO" in step S850), the pattern obtaining unit 464 requests the page check unit 414 to transmit the write data WDATA' instead of the compressed data COM_DATA to the parity generation unit 422. Consequently, the page check unit 414 provides the write data WDATA' to the parity generation unit 422, and the parity generation unit 422 generates the parity bit PTY based on the write data WDATA' in step S832. The write data WDATA' and the parity bit PTY may be transmitted to the memory device 500 on a basis of a single page in step S834. Accordingly, the write operation is completed.

When the error mask pattern MSK_PAT capable of covering the error bits exists in the pattern table 450 (that is, "YES" in step S850), the pattern obtaining unit 464 generates the pattern information MSK_INF on the error mask pattern MSK_PAT. The pattern obtaining unit 464 reflects the error mask pattern MSK_PAT in the compressed data COM_DATA in step S860. The pattern obtaining unit 464 provides the compressed data COM_DATA in which the error mask pattern MSK_PAT is reflected to the parity generation unit 422. The parity generation unit 422 generates the parity bit PTY based on the compressed data COM_DATA in which the error mask pattern MSK_PAT is reflected in step S870. The compressed data COM_DATA, the parity bit PTY, the compression information COM_INF and the pattern information MSK_INF may be transmitted to the memory device 500 on a basis of a single page in step S880. Accordingly, the write operation is completed.

In accordance with the embodiments of the disclosure, a plurality of error bits is concentrated in an area remaining after a page in which the error bits occur is compressed. The error bits are masked based on an error mask pattern, whereby error correction performance of the memory system may be improved.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A memory system comprising:
   a memory device, including a plurality of memory cells, suitable for reading and writing data with a parity bit on a basis of a page; and
   a memory controller suitable for
   generating error-corrected data by detecting and correcting error bits included in the data using the parity bit,
   compressing the error-corrected data to generate compressed data and obtaining an error mask pattern based on the compressed data, when a number of the error bits is equal to or less than a first threshold value and greater than a second threshold value, and
   controlling to write the compressed data, the parity bit updated based on the compressed data in which the error mask pattern is reflected, compression information on the compressed data and pattern information on the error mask pattern to the page.

2. The memory system of claim 1, wherein the page includes a data region and a spare region, the compressed data is stored in the data region, and the updated parity bit, the compressed information and the pattern information are stored in the spare region.

3. The memory system of claim 2, wherein the memory controller includes:
   an error correction block suitable for generating the error-corrected data by detecting and correcting the error bits included in the data using the parity bit;
   a compression block suitable for compressing the error-corrected data to generate the compressed data and generating the compression information on the compressed data when the number of error bits is equal to or less than the first threshold value and greater than the second threshold value;
   a mask pattern handling block suitable for obtaining the error mask pattern based on the compressed data and generating the pattern information on the error mask pattern; and
   a parity generation block suitable for updating the parity bit based on the compressed data.

4. The memory system of claim 3, wherein the memory controller further includes:
   a pattern table suitable for storing a plurality of patterns, which are defined in advance.

5. The memory system of claim 4, wherein the mask pattern handling block checks a position of error bits of the data region excluding the compressed data, selects a pattern capable of maximally covering the error bits among the patterns as the error mask pattern, and generates the pattern information on the error mask pattern.

6. The memory system of claim 3, wherein the error correction block provides the error-corrected data to a host when the number of error bits is equal to or less than the first threshold value, and provides an error failure signal to the host when the number of error bits is greater than the first threshold value.

7. The memory system of claim 1, wherein the first threshold value is a number of correctable error bits.

8. An operating method of a memory system, comprising:
generating error-corrected data by detecting and correcting error bits included in data using a parity bit, which are read out from a specific page;
compressing the error-corrected data to generate compressed data when a number of the error bits is equal to or less than a first threshold value and greater than a second threshold value;
obtaining an error mask pattern based on the compressed data;
updating the parity bit based on the compressed data in which the error mask pattern is reflected; and
writing the compressed data, the updated parity bit, compression information on the compressed data and pattern information on the error mask pattern to the specific page.

9. The operating method of claim 8, wherein the specific page includes a data region and a spare region, the compressed data is stored in the data region, and the updated parity bit, the compression information and the pattern information are stored in the spare region.

10. The operating method of claim 9, wherein the obtaining of the error mask pattern includes:
checking a position of error bits of the data region excluding the compressed data;
selecting a pattern capable of maximally covering the error bits among a plurality of patterns which are defined in advance in a pattern table; and
generating the pattern information on the error mask pattern.

11. The operating method of claim 8, wherein the first threshold value is a number of correctable error bits.

12. The operating method of claim 8, further comprising:
providing the error-corrected data to a host when the number of error bits is equal to or less than the first threshold value and greater than the second threshold value.

13. The operating method of claim 8, further comprising:
providing an error failure signal to a host when the number of error bits is greater than the first threshold value; and
providing the error-corrected data to the host when the number of error bits is equal to or less than the second threshold value.

14. The operating method of claim 8, wherein the detecting and correcting of the error bits included in the data using the parity bit includes:
searching an error mask pattern corresponding to the pattern information among a plurality of patterns which are defined in advance in a pattern table when the data read out from the specific page is compressed;
generating masked data by reflecting the error mask pattern in the data;
generating error-corrected masked data by correcting error bits of the masked data based on the parity bit; and
decompressing the error-corrected masked data based on the compression information and providing decompressed data to a host.

15. An operating method of a memory system, comprising:
checking how many writable pages are in a memory device;
compressing write data to generate compressed data when a number of the writable pages is within a specific threshold;
obtaining an error mask pattern based on the compressed data;
generating a parity bit based on the compressed data in which the error mask pattern is reflected; and
writing the compressed data, the parity bit, compression information on the compressed data, and pattern information on the error mask pattern to a specific page.

16. The operating method of claim 15, wherein the specific page includes a data region and a spare region, the compressed data is stored in the data region, and the parity bit, the compression information and the pattern information are stored in the spare region.

17. The operating method of claim 16, wherein the obtaining of the error mask pattern includes:
detecting error bits included in the write data;
checking a position of the error bits of the data region excluding the compressed data;
selecting a pattern capable of maximally covering the error bits among a plurality of patterns which are defined in advance in a pattern table; and
generating the pattern information on the error mask pattern.

18. The operating method of claim 15, further comprising:
generating the parity bit based on the write data when the number of writable pages exceeds the specific threshold; and
writing the write data and the parity bit to the specific page.

19. A memory system comprising:
a memory device, including a plurality of pages, each storing data with a parity bit; and
a memory controller suitable for performing an error detection and correction on at least one error bit of the data outputted from the memory device,
wherein the memory controller recognizes an error mask pattern based on the data and the parity bit, when a number of error bits detected based on the data and the parity bit is beyond a predetermined range, to adjust parity information used for the data corresponding to a write command.

* * * * *